United States Patent [19]

Ideler et al.

[11] Patent Number: 5,695,872
[45] Date of Patent: Dec. 9, 1997

[54] THERMALLY CONDUCTIVE, ELECTRICALLY INSULATING GLUED CONNECTION, METHOD FOR THE PRODUCTION THEREOF AND EMPLOYMENT THEREOF

[75] Inventors: Karl-Heinz Ideler, Spardorf; Dieter Dlugosch, Heilsbronn; Winfried Arz, Burgthann, all of Germany

[73] Assignee: Siemens Aktiengesellschaft, Munich, Germany

[21] Appl. No.: 371,857

[22] Filed: Jan. 12, 1995

[30] Foreign Application Priority Data

Jan. 20, 1994 [DE] Germany .................. 4401608.5

[51] Int. Cl.$^6$ .................................................. B32B 5/16
[52] U.S. Cl. .................. 428/323; 361/742; 361/746; 428/329; 428/331
[58] Field of Search .................. 428/323, 329, 428/331; 361/742, 746

[56] References Cited

U.S. PATENT DOCUMENTS

| | | | |
|---|---|---|---|
| 4,307,147 | 12/1981 | Ohishi et al. | 428/268 |
| 4,689,250 | 8/1987 | Quella et al. | 427/216 |
| 5,328,087 | 7/1994 | Nelson et al. | 228/175 |
| 5,445,308 | 8/1995 | Nelson et al. | 228/121 |

FOREIGN PATENT DOCUMENTS

| | | |
|---|---|---|
| 0 561 048 | 9/1993 | European Pat. Off. . |
| AS 1 213 500 | 3/1966 | Germany . |
| OS 33 18 729 | 11/1984 | Germany . |
| OS 39 39 627 | 6/1991 | Germany . |
| OS 39 39 628 | 6/1991 | Germany . |
| WO 89/11723 | 11/1989 | WIPO . |

OTHER PUBLICATIONS

Patents Abstracts of Japan, C-805, Feb. 13, 1991, vol. 15/No. 60, Japanese Application No. 64-107283.

Patents Abtracts of Japan, C-916, Mar. 3, 1992, vol. 16/No. 86, Japanese Application No. 2-72144.

*Primary Examiner*—H. Thi Le
*Attorney, Agent, or Firm*—Hill, Steadman & Simpson

[57] ABSTRACT

A glued connection suitable for attaching high power electronic components to a mounting location, such as on a cooling element, has an electrically insulating base layer of unfilled adhesive applied onto at least one surface of the parts to be glued. An adhesive filled with an electrically insulating powder that has good thermal conductivity is applied onto at least one part surface. Grains of the powder puncture the base layer, and the thickness of the glued connection thus essentially corresponds to the size of the grains.

7 Claims, 1 Drawing Sheet

THERMALLY CONDUCTIVE, ELECTRICALLY INSULATING GLUED CONNECTION, METHOD FOR THE PRODUCTION THEREOF AND EMPLOYMENT THEREOF

BACKGROUND OF THE INVENTION

1. Field of the Invention

The present invention relates to a thermally conductive, electrically insulating glued connection as well as to a method for the manufacture thereof and to the employment thereof.

2. Description of the Prior Art

Thermally conductive electrically insulating glued connections are required, for example, in power electronics. Gluing power semiconductors to cooling members offers great advantages in terms of manufacturing technology. Dependent on the operating voltage and dissipated power of the respective power semiconductor, however, gluing makes high demands on the electrical strength and on the thermal conductivity of the glued connection. Further, the glued location must be mechanically reliable at higher operating temperatures.

Gluing methods for electrical components are known from various publications. For example, German OS 33 18 729 discloses an arrangement for the electrically insulating mounting of a semiconductor component on a cooling member with an insulation layer, whereby a laminate composed of aluminum oxide fibers and an electrically insulating adhesive is arranged between the cooling member and the electrical terminal of the component. An inorganic glue with $Al_2O_3$ ceramic powder can thereby be employed as adhesive.

German OS 30 32 744, equivalent to U.S. Pat. No. 4,307,147, discloses an electrically insulating base with high thermal conductivity specifically for electronic components, wherein an insulating film having a dispersion of metal oxide particles is applied on a metal plate. This arrangement probably exhibits only slight electric strength.

European Application 0 182 280, equivalent to U.S. Pat. No. 4,689,250, discloses a filler having metal powder cross-linked with plastic for the manufacture of powder compounds. The metal grains have a plastic envelope produced by cross-linking are arranged in an optimally tight packing. An electrical insulation having simultaneous heat elimination is thus to be realized.

German OS 1 213 500 discloses a highly thermally conductive insulating film with filler as a base for transistors or other component parts, whereby the filler grains are also intended to serve as spacer elements.

German OS 38 17 400, equivalent to WO 89/11723, proposes a thermally conductive, electrically insulating glue for insulation of component parts, the base material thereof having a high proportion of at least one highly thermally conductive filler and a solid additive that is composed of a plurality of parts at least of approximately the same size mixed with the filler.

None of these known insulating materials, however, satisfies the demands made on glued connections in power electronics, particularly in higher ranges of voltage and dissipated power.

SUMMARY OF THE INVENTION

It is an object of the present invention to provide a glued connection and a method for the production thereof such that the glued connection has high electric strength as well as high mechanical reliability even at higher operating temperatures. Further, the glued connection should be employed in an advantageous way.

The above object is achieved in accordance with the principles of the present invention in a glued connection between respective facing surfaces of two workpieces, the glued connection being formed by an electrically insulating base layer of unfilled adhesive applied on the surface of at least one of the workpieces, an electrically insulating adhesive containing an electrically insulating powder having good thermal conductivity applied on a surface of one of the workpieces, and the electrically insulating powder having grains which puncture the base layer when the workpieces are pressed together, the powder grains including largest grains which have a grain size which thus substantially defines a thickness of the glued connection.

As used herein "unfilled adhesive" means an adhesive without any filler therein.

In a method for producing such a glued connection between two workpieces, a base layer of an unfilled adhesive which encloses all peaks projecting from a workpiece surface is applied onto that workpiece surface, the unfilled adhesive is pre-hardened to an extent such that the unfilled adhesive is still soft enough to be punctured by grains upon the application of pressure, an electrically insulating adhesive is prepared by mixing an adhesive with electrically insulating powder containing powder grains, the electrically insulating adhesive with the powder grains is applied onto the base layer, or onto a workpiece surface not coated with the base layer, and the workpiece surfaces are pressed together so as to cause the powder grains to penetrate into the base layer and thereby determine the thickness of the glued connection, dependent on a size of a largest of the powder grains. The base layer and the electrically insulating adhesive are then cured.

DESCRIPTION OF THE PREFERRED EMBODIMENTS

Figure 1:
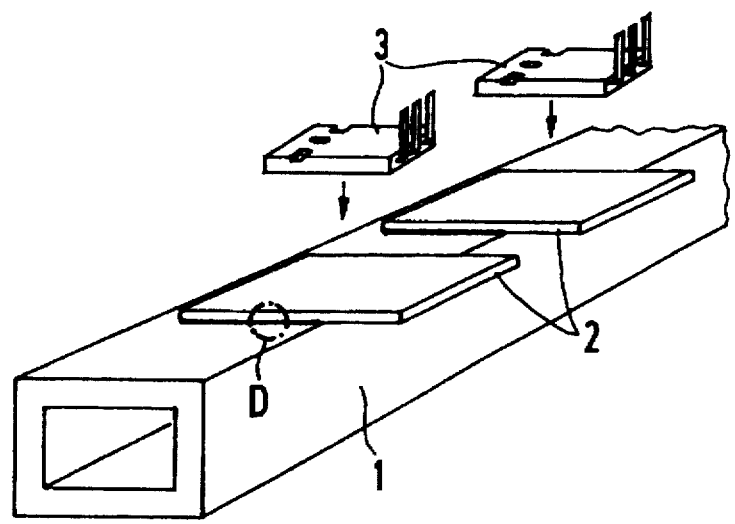
FIG. 1 shows an arrangement having semiconductor components attached onto a cooling tube by means of a glued connection produced in accordance with the principles of the present invention.
Figure 2:
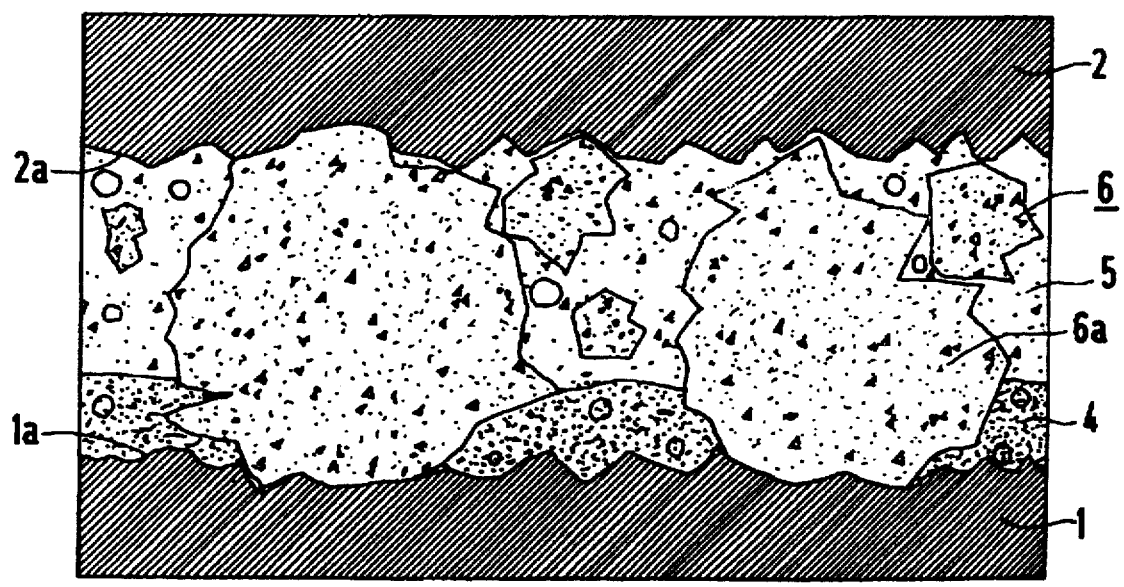
FIG. 2 is a highly enlarged sectional view of the glued connection in the region D of FIG. 1.

In the illustrated exemplary embodiment, power semiconductors 3 are cooled by a water-fed cooling element 1 essentially composed of a tube having a rectangular cross section. The dissipated heat of the power semiconductors 3 is transferred to the cooling element 1 via laminae 2. What is described here is the glued connection between the laminae 2 and the cooling element 1, which must be well-insulated since the laminae 22 lie at the operating voltage.

The cooling element 1 is pre-treated in the region of the glue locations; in particular, the surface thereof is smoothed so that peaks do not project into the glue layer, as would occur given excessive surface roughness, and degrade the electric strength. Subsequently, a base layer 4 is applied at least on the glue locations; for simplicity, however, it is applied on the entire surface of the cooling element. A coating of the entire surface of the cooling element 1 with the base layer has the advantage that the entire cooling element 1 is protected against neighboring parts that carry voltage.

The base layer 4 is produced by an epoxy resin whose viscosity is set with a precisely dosed addition of a thixotroping agent. The consistency of this mixture must be of such a nature that the highest peaks that project from the pre-treated surface layer are also completely enclosed. The tightness of this base layer can be checked, for example, with an arcing test. If a single layer of this type is not adequate in order to enclose all surface peaks, two layers having lower viscosity can be applied. This alternative offers two advantages: first, fewer air bubbles that are smaller in size remain in the lower viscosity glue layer and, second, it is improbable that two air bubbles will come to lie exactly above one another and thus degrade the insulating capability of the layer. In order to avoid air bubbles, a number of evacuation events can be implemented during the processing, for example, after the addition of the thixotroping agent, after the addition of a hardener part into the epoxy resin, as well as after the application of the base layer onto the cooling element 1.

After application of the base layer, this is somewhat cured in a furnace. The base layer should thus be rendered insensitive to damage and disturbance that can still occur in the following gluing process. Nonetheless, the base layer should remain soft enough that harder particles can be pressed into the base layer 4 with the application of pressing power. Since the unfilled adhesive of the base layer 4 exhibits poor thermal conduction, this is kept as thin as possible. The base layer 4, however, can be dimensioned such that it exhibits the full electric strength required for the arrangement, even without the additional glue layer yet to be applied. Given an average surface roughness of $R_z=15$ through 25 µm at the surfaces of material to be glued and given a required electric strength of 2.5 KV, a layer thickness of the base layer 4 of from 40 through 50 µm should generally be adequate.

Subsequently, a second adhesive layer 5 is applied as a thermally conductive layer. This layer 5 is likewise composed of an epoxy resin whose base constituents (resin and hardener) are the same as in the base layer 4. The thermal conductivity of the adhesive in the layer 5 is significantly improved by admixing a ceramic powder into the adhesive layer 5, aluminum oxide in this case. Whereas the unfilled adhesive of the base layer 4 typically has a thermal conductivity of 0.3 V/mK, the filled adhesive 5 has a thermal conductivity of 1.3 W/mK.

The adhesive layer 5 filled with aluminum oxide powder is applied by dosing directly onto the second component, namely the laminae 2. Subsequently, the laminae 2 with the filled adhesive 5 is pressed against the cooling element 1 at the intended locations.

A special characteristic of the gluing process is that the layer thickness of the glued connection is essentially defined by the grain size of the aluminum oxide powder. Since the extremely hard aluminum oxide can barely be deformed, even under extremely high pressure, it is always the largest grains that define the spacing between the workpieces to be glued, given the thin adhesive layers present here. Smaller grains that are, also present in the aluminum oxide powder fill the interspaces between the large grains. For example, an aluminum oxide powder having a grain diameter of up to 120 µm can be employed.

As a result of a high pressing power, the aluminum oxide grains 6a are pressed into the base layer 4 that is still relatively soft and thus reside largely in direct contact with the surface of the workpiece 1. A good heat flow between the workpieces 1 and 2 is thus obtained via the ceramic grains. When the components are pressed together, the spacing determined by the grain size of the aluminum oxide power is automatically set.

Finally, the glued connection can be cured in a furnace.

High electric strength as well as good thermal conductivity can be achieved with this technique. The manufacturing process is also relatively simple and uncritical as to tolerances. The thermal resistivity can be set relatively exactly on the basis of the selection of the grain size of the aluminum oxide powder, whereby, of course, the electric strength increases with increasing grain size but the heat transmission coefficient decreases starting from a specific grain size. The filled adhesive, however, can only be incompletely evacuated and the risk is thus present that air inclusions will reduce the electric strength. The full electric strength is therefore advantageously already assured by the base layer 4 of unfilled adhesive that can be evacuated better, whereas the filled adhesive 5 ensures a good heat elimination. Due to the above-described properties, this gluing is also suitable given power semiconductors having high operating voltages and dissipated powers.

Although modifications and changes may be suggested by those skilled in the art, it is the intention of the inventors to embody within the patent warranted hereon all changes and modifications as reasonably and properly come within the scope of their contribution to the art.

We claim as our invention:

1. A glued connection between respective facing surfaces of two workpieces, said glued connection comprising:

an electrically insulating base layer of unfilled adhesive applied on a surface of at least one of said workpieces facing a surface of the other of said workpieces;

an electrically insulating adhesive containing a substantially non-deformable electrically insulating and thermally conductive powder applied on said surface or on said base layer of one of said workpieces; and said electrically insulating powder having powder grains which puncture said base layer, and said powder grains including largest grains having a grain size which substantially defines a thickness of said glued connection and smaller grains disposed in interstices between said largest grains for increasing a filling factor and a thermal conductivity of said glued connection.

2. A glued connection as claimed in claim 1 wherein said base layer and said adhesive comprise epoxy resins.

3. A glued connection as claimed in claim 1 wherein said powder comprises a ceramic powder.

4. A glued connection as claimed in claim 3 wherein said ceramic powder comprises $Al_2O_3$.

5. A glued connection as claimed in claim 1 wherein said largest grains of said powder grains have a maximum grain size of 120 µm.

6. A glued connection as claimed in claim 1 wherein said base layer has a thickness in a range from 40 through 50 µm.

7. A glued connection as claimed in claim 1 wherein said glued connection is to exhibit a predetermined dielectric strength, and wherein said base layer exhibits the full, predetermined dielectric strength to be exhibited by said glued connection.

* * * * *